(12) United States Patent
Debnath et al.

(10) Patent No.: US 12,020,121 B2
(45) Date of Patent: Jun. 25, 2024

(54) REMOVING A TRANSLATION ERROR BETWEEN A PROGRAMMED STRENGTH AND AN APPLIED STRENGTH OF QUANTUM GATES

(71) Applicant: IonQ, Inc., College Park, MD (US)

(72) Inventors: Shantanu Debnath, Lanham, MD (US); Vandiver Chaplin, Brooklyn, NY (US); Kristin M. Beck, Livermore, CA (US); Melissa Jameson, Arlington, VA (US); Jason Hieu Van Nguyen, Hyattsville, MD (US)

(73) Assignee: IonQ, Inc., College Park, MD (US)

( * ) Notice: Subject to any disclaimer, the term of this patent is extended or adjusted under 35 U.S.C. 154(b) by 0 days.

(21) Appl. No.: 18/048,268

(22) Filed: Oct. 20, 2022

(65) Prior Publication Data

US 2023/0129122 A1    Apr. 27, 2023

Related U.S. Application Data

(60) Provisional application No. 63/270,227, filed on Oct. 21, 2021.

(51) Int. Cl.
*H03K 17/92* (2006.01)
*G06N 10/70* (2022.01)

(52) U.S. Cl.
CPC ............ *G06N 10/70* (2022.01); *H03K 17/92* (2013.01)

(58) Field of Classification Search
CPC ...................................................... H03K 17/92
USPC ........................................................ 327/527
See application file for complete search history.

(56) References Cited

U.S. PATENT DOCUMENTS

| 10,998,163 | B2 * | 5/2021 | Monroe | G06N 10/00 |
| 2019/0138928 | A1 * | 5/2019 | Monroe | G06N 10/00 |
| 2020/0219001 | A1 * | 7/2020 | Kim | H03K 19/20 |
| 2020/0301241 | A1 * | 9/2020 | Duan | G02F 1/33 |

\* cited by examiner

*Primary Examiner* — Tomi Skibinski
(74) *Attorney, Agent, or Firm* — ARENTFOX SCHIFF LLP

(57) ABSTRACT

Aspects of the present disclosure relate generally to systems and methods for use in the implementation and/or operation of quantum information processing (QIP) systems, and more particularly, to techniques for removing or correcting for translation errors between a programmed strength and an applied strength of quantum gates. A method is described that includes determining, for each quantum gate in a quantum operation, a non-linearity between an applied strength of a laser beam used for the respective quantum gate and a programmed strength intended to be applied by the laser beam for the respective quantum gate. The method further includes linearizing the non-linearity for each quantum gate and storing linearization information in memory. Moreover, the method includes applying the linearization information to correct for the non-linearity when implementing each quantum gate as part of the quantum operation. A system is also described that is configured to implement the method described above.

20 Claims, 14 Drawing Sheets

REMOVING A TRANSLATION ERROR BETWEEN A PROGRAMMED STRENGTH AND AN APPLIED STRENGTH OF QUANTUM GATES

PRIORITY

This application claims priority to and the benefit from U.S. Provisional Application No. 63/270,227, filed on Oct. 21, 2021, and titled "Removing a Translation Error Between a Programmed Strength and an Applied Strength of Quantum Gates," the contents of which are incorporated herein by reference in their entirety.

TECHNICAL FIELD

Aspects of the present disclosure relate generally to systems and methods for use in the implementation, operation, and/or use of quantum information processing (QIP) systems.

BACKGROUND

Trapped atoms are one of the leading implementations for quantum information processing or quantum computing. Atomic-based qubits may be used as quantum memories, as quantum gates in quantum computers and simulators, and may act as nodes for quantum communication networks. Qubits based on trapped atomic ions enjoy a rare combination of attributes. For example, qubits based on trapped atomic ions have very good coherence properties, may be prepared and measured with nearly 100% efficiency, and are readily entangled with each other by modulating their Coulomb interaction with suitable external control fields such as optical or microwave fields. These attributes make atomic-based qubits attractive for extended quantum operations such as quantum computations or quantum simulations.

It is therefore important to develop new techniques that improve the design, fabrication, implementation, control, and/or functionality of different QIP systems used as quantum computers or quantum simulators, and particularly for those QIP systems that handle operations based on atomic-based qubits.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

This disclosure describes various aspects of methods and systems for removing or correcting for translation errors that occur between a programmed strength and an applied strength of quantum gates.

A method is described that includes determining, for each quantum gate in a quantum operation, a non-linearity between an applied strength of a laser beam used for the respective quantum gate and a programmed strength intended to be applied by the laser beam for the respective quantum gate. The method includes linearizing the non-linearity for each quantum gate and storing linearization information in memory. The method further includes applying the linearization information to correct for the non-linearity when implementing each quantum gate as part of the quantum operation.

A quantum computer is described that includes a trap configured to hold multiple ions for implementing quantum gates and a controller. The controller is configured to determine, for each quantum gate in a quantum operation, a non-linearity between an applied strength of a laser beam used for the respective quantum gate and a programmed strength intended to be applied by the laser beam for the respective quantum gate. The controller is further configured to linearize the non-linear relationship for each quantum gate and storing linearization information in memory. The controller is further configured to apply the linearization information to correct for the non-linearity when implementing each quantum gate as part of the quantum operation.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings or figures is intended as a description of various configurations or implementations and is not intended to represent the only configurations or implementations in which the concepts described herein may be practiced. The detailed description includes specific details for the purpose of providing a thorough understanding of various concepts. However, it will be apparent to those skilled in the art that these concepts may be practiced without these specific details or with variations of these specific details. In some instances, well known components are shown in block diagram form, while some blocks may be representative of one or more well-known components.

Quantum gates are implemented and performed on trapped ion qubits by applying lasers tuned to amplitude, frequency, and phases appropriate for each kind of quantum operation. Although the programmed frequency and phase can be applied quite precisely, that is, with a constant offset, during a quantum operation, the amplitude on the other hand can suffer from compression. That is, the amplitude that is applied is different from the intended amplitude. Such a compression can change from time to time due to changes in the laser alignment in the system, for example. Since the laser amplitude determines the strength of driving a quantum gate, such a compression can result in a mismatch between the programmed drive strength and the achieved (actually applied) drive strength of any quantum operation, thereby contributing to loss in fidelity of the operation.

Solutions to the issues described above are explained in more detail in connection with FIGS. 1-8, with FIGS. 1-3 providing a background of QIP systems or quantum computers, and more specifically, of atomic-based QIP systems or quantum computers. The terms QIP systems and quantum computers may be used interchangeably throughout this disclosure.

Figure 1:
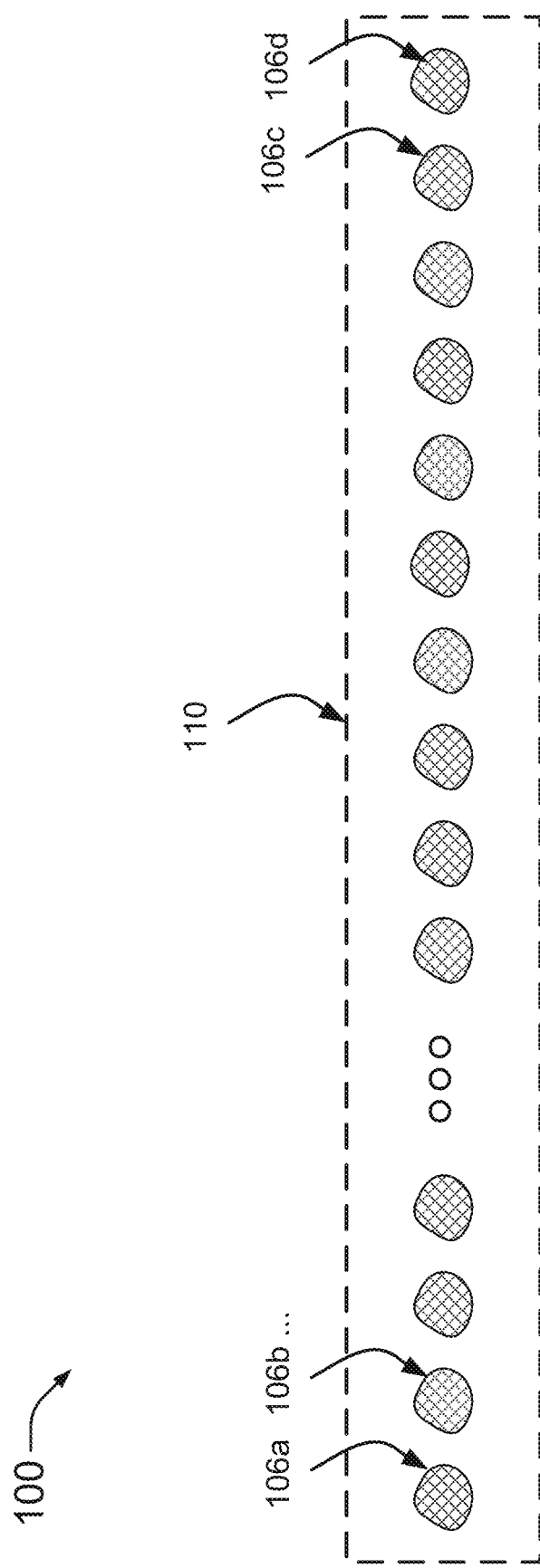
FIG. 1 illustrates a view of atomic ions a linear crystal or chain in accordance with aspects of this disclosure.
Figure 2:
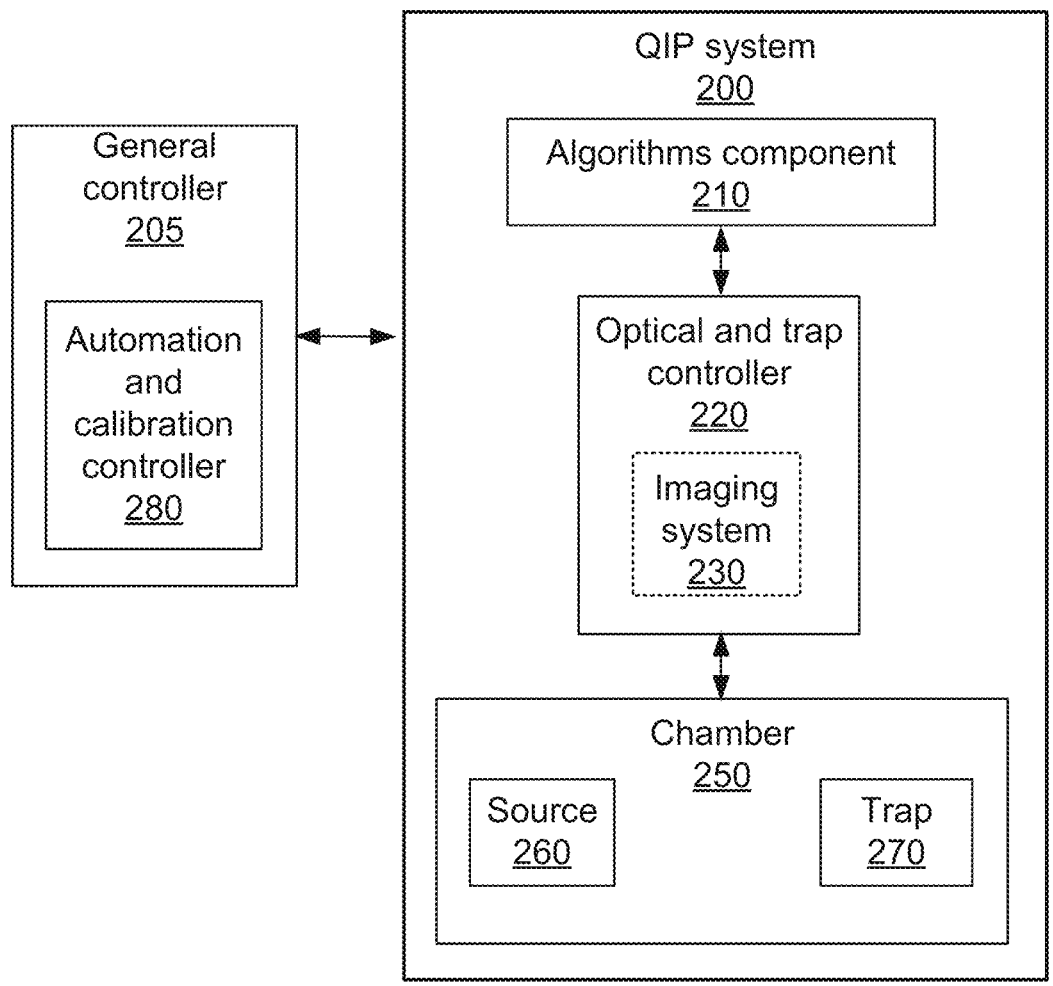
FIG. 2 illustrates an example of a quantum information processing (QIP) system in accordance with aspects of this disclosure.

FIG. 1 illustrates a diagram 100 with multiple atomic ions or ions 106 (e.g., ions 106a, 106b, . . . , 106c, and 106d) trapped in a linear crystal or chain 110 using a trap (not shown; the trap can be inside a vacuum chamber as shown in FIG. 2). The trap maybe referred to as an ion trap. The ion trap shown may be built or fabricated on a semiconductor substrate, a dielectric substrate, or a glass die or wafer (also referred to as a glass substrate). The ions 106 may be provided to the trap as atomic species for ionization and confinement into the chain 110. Some or all of the ions 106 may be configured to operate as qubits in a QIP system. Moreover, a quantum processor or quantum processing unit may indicate a portion of the quantum computer or QIP system that includes the chain 110 and uses the ions 106 in the chain 110 to perform quantum operations.

In the example shown in FIG. 1, the trap includes electrodes for trapping or confining multiple ions into the chain 110 laser-cooled to be nearly at rest. The number of ions trapped can be configurable and more or fewer ions may be trapped. The ions can be Ytterbium ions (e.g., $^{171}Yb^+$ ions), for example. The ions are illuminated with laser (optical) radiation tuned to a resonance in $^{171}Yb^+$ and the fluorescence of the ions is imaged onto a camera or some other type of detection device (e.g., photomultiplier tube or PMT). In this example, ions may be separated by a few microns (μm) from each other, although the separation may vary based on architectural configuration. The separation of the ions is determined by a balance between the external confinement force and Coulomb repulsion and does not need to be uniform. Moreover, in addition to Ytterbium ions, neutral atoms, Rydberg atoms, or other types of atomic-based qubit technologies may also be used. Moreover, ions of the same species, ions of different species, and/or different isotopes of ions may be used. The trap may be a linear RF Paul trap, but other types of confinement devices may also be used, including optical confinements. Thus, a confinement device may be based on different techniques and may hold ions, neutral atoms, or Rydberg atoms, for example, with an ion trap being one example of such a confinement device. The ion trap may be a surface trap, for example.

FIG. 2 illustrates a block diagram that shows an example of a QIP system 200. The QIP system 200 may also be referred to as a quantum computing system, a quantum computer, a computer device, a trapped ion system, or the like. The QIP system 200 may be part of a hybrid computing system in which the QIP system 200 is used to perform quantum computations and operations and the hybrid computing system also includes a classical computer to perform classical computations and operations. The quantum and classical computations and operations may interact in such a hybrid system.

Shown in FIG. 2 is a general controller 205 configured to perform various control operations of the QIP system 200. These control operations may be performed by an operator, may be automated, or a combination of both. Instructions for at least some of the control operations may be stored in memory (not shown) in the general controller 205 and may be updated over time through a communications interface (not shown). Although the general controller 205 is shown separate from the QIP system 200, the general controller 205 may be integrated with or be part of the QIP system 200. The general controller 205 may include an automation and calibration controller 280 configured to perform various calibration, testing, and automation operations associated with the QIP system 200. These calibration, testing, and automation operations may involve, for example, all or part of an algorithms component 210, all or part of an optical and trap controller 220 and/or all or part of a chamber 250.

The QIP system 200 may include the algorithms component 210 mentioned above, which may operate with other parts of the QIP system 200 to perform or implement quantum algorithms, quantum applications, or quantum operations. The algorithms component 210 may be used to perform or implement a stack or sequence of combinations of single qubit operations and/or multi-qubit operations (e.g., two-qubit operations) as well as extended quantum computations. The algorithms component 210 may also include software tools (e.g., compilers) that facility such performance or implementation. As such, the algorithms component 210 may provide, directly or indirectly, instructions to various components of the QIP system 200 (e.g., to the optical and trap controller 220) to enable the performance or implementation of the quantum algorithms, quantum applications, or quantum operations. The algorithms component 210 may receive information resulting from the performance or implementation of the quantum algorithms, quantum applications, or quantum operations and may process the information and/or transfer the information to another component of the QIP system 200 or to another device (e.g., an external device connected to the QIP system 200) for further processing.

The QIP system 200 may include the optical and trap controller 220 mentioned above, which controls various aspects of a trap 270 in the chamber 250, including the generation of signals to control the trap 270. The trap 270 may be associated with the quantum processor or quantum processing unit in the QIP system 200. The optical and trap controller 220 may also control the operation of lasers, optical systems, and optical components that are used to provide the optical beams that interact with the atoms or ions in the trap. Optical systems that include multiple components may be referred to as optical assemblies. The optical beams are used to set up the ions, to perform or implement quantum algorithms, quantum applications, or quantum operations with the ions, and to read results from the ions. Control of the operations of laser, optical systems, and optical components may include dynamically changing operational parameters and/or configurations, including controlling positioning using motorized mounts or holders. When used to confine or trap ions, the trap 270 may be referred to as an ion trap. The trap 270, however, may also be used to trap neutral atoms, Rydberg atoms, and other types of atomic-based qubits. The lasers, optical systems, and optical components can be at least partially located in the optical and trap controller 220, an imaging system 230, and/or in the chamber 250.

The QIP system 200 may include the imaging system 230. The imaging system 230 may include a high-resolution imager (e.g., CCD camera) or other type of detection device (e.g., PMT) for monitoring the ions while they are being provided to the trap 270 and/or after they have been provided to the trap 270 (e.g., to read results). In an aspect, the imaging system 230 can be implemented separate from the optical and trap controller 220, however, the use of fluorescence to detect, identify, and label ions using image processing algorithms may need to be coordinated with the optical and trap controller 220.

In addition to the components described above, the QIP system 200 can include a source 260 that provides atomic species (e.g., a plume or flux of neutral atoms) to the chamber 250 having the trap 270. When atomic ions are the basis of the quantum operations, that trap 270 confines the atomic species once ionized (e.g., photoionized). The trap 270 may be part of what may be referred to as a processor or processing portion of the QIP system 200. That is, the trap 270 may be considered at the core of the processing operations of the QIP system 200 since it holds the atomic-based qubits that are used to perform or implement the quantum operations or simulations. At least a portion of the source 260 may be implemented separate from the chamber 250.

It is to be understood that the various components of the QIP system 200 described in FIG. 2 are described at a high-level for ease of understanding. Such components may include one or more sub-components, the details of which may be provided below as needed to better understand certain aspects of this disclosure.

Aspects of this disclosure may be implemented at least partially using the optical and trap controller 220, which may control and/or perform certain functions associated with removing or correcting for translation errors that occur between a programmed strength and an applied strength of quantum gates. In some implementations, the general controller 205 may be used in combination with the optical and trap controller 220 to remove or correct translation errors.

Figure 3:
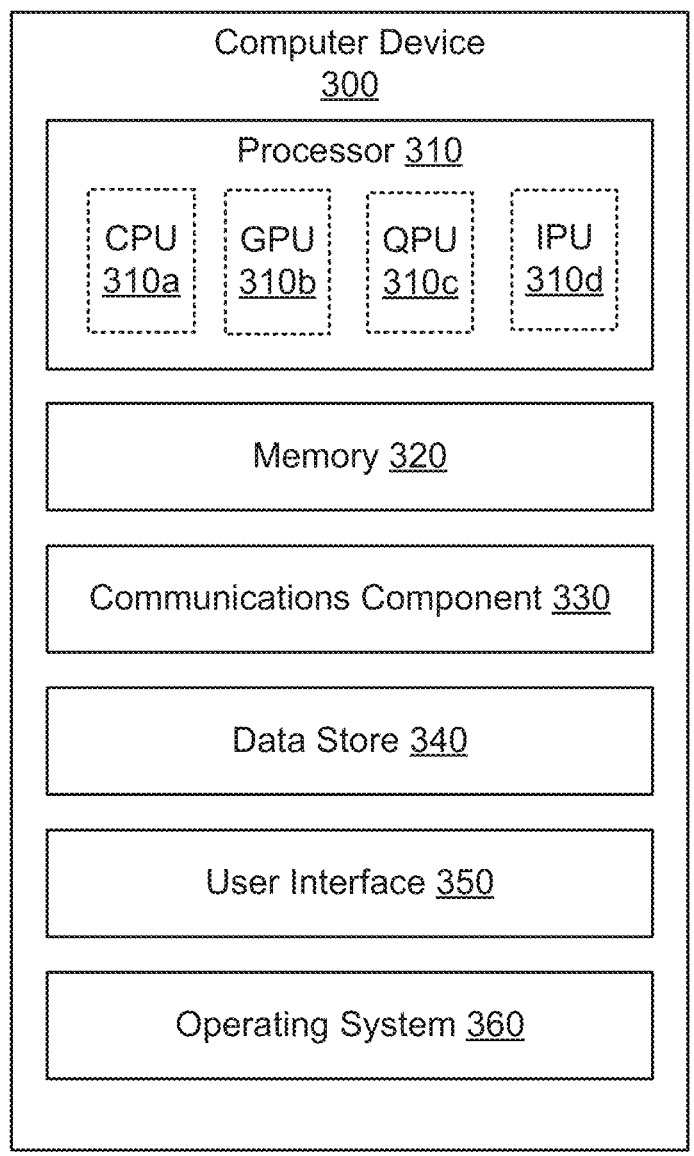
FIG. 3 illustrates an example of a computer device in accordance with aspects of this disclosure.
Figure 4:
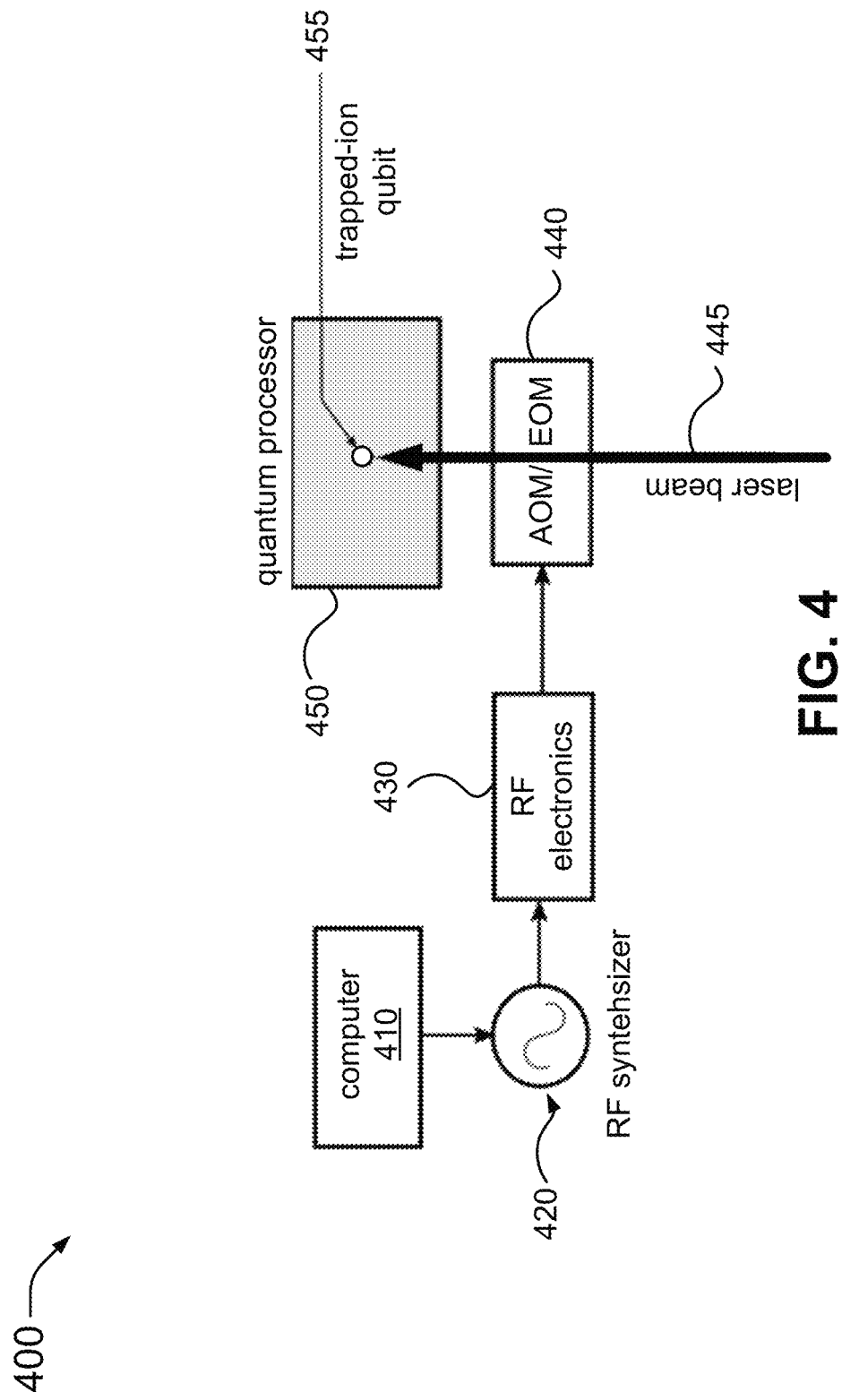
FIG. 4 illustrates an example of a radio frequency (RF) chain for implementing quantum operations on a trapped-ion quantum computer in accordance with aspects of this disclosure.

Referring now to FIG. 3, an example of a computer system or device 300 is shown. The computer device 300 may represent a single computing device, multiple computing devices, or a distributed computing system, for example. The computer device 300 may be configured as a quantum computer (e.g., a QIP system), a classical computer, or to perform a combination of quantum and classical computing functions, sometimes referred to as hybrid functions or operations. For example, the computer device 300 may be used to process information using quantum algorithms, classical computer data processing operations, or a combination of both. In some instances, results from one set of operations (e.g., quantum algorithms) are shared with another set of operations (e.g., classical computer data processing). A generic example of the computer device 300 implemented as a QIP system capable of performing quantum computations and simulations is, for example, the QIP system 200 shown in FIG. 2.

The computer device 300 may include a processor 310 for carrying out processing functions associated with one or more of the features described herein. The processor 310 may include a single processor, multiple set of processors, or one or more multi-core processors. Moreover, the processor 310 may be implemented as an integrated processing system and/or a distributed processing system. The processor 310 may include one or more central processing units (CPUs) 310a, one or more graphics processing units (GPUs) 310b, one or more quantum processing units (QPUs) 310c, one or more intelligence processing units (IPUs) 310d (e.g., artificial intelligence or AI processors), or a combination of some or all those types of processors. In one aspect, the processor 310 may refer to a general processor of the computer device 300, which may also include additional processors 310 to perform more specific functions (e.g., including functions to control the operation of the computer device 300). Quantum operations may be performed by the QPUs 310c. Some or all of the QPUs 310c may use atomic-based qubits, however, it is possible that different QPUs are based on different qubit technologies.

The computer device 300 may include a memory 320 for storing instructions executable by the processor 310 to carry out operations. The memory 320 may also store data for processing by the processor 310 and/or data resulting from processing by the processor 310. In an implementation, for example, the memory 320 may correspond to a computer-readable storage medium that stores code or instructions to perform one or more functions or operations. Just like the processor 310, the memory 320 may refer to a general memory of the computer device 300, which may also include additional memories 320 to store instructions and/or data for more specific functions.

It is to be understood that the processor 310 and the memory 320 may be used in connection with different operations including but not limited to computations, calculations, simulations, controls, calibrations, system management, and other operations of the computer device 300, including any methods or processes described herein.

Further, the computer device 300 may include a communications component 330 that provides for establishing and maintaining communications with one or more parties utilizing hardware, software, and services. The communications component 330 may also be used to carry communications between components on the computer device 300, as well as between the computer device 300 and external devices, such as devices located across a communications network and/or devices serially or locally connected to computer device 300. For example, the communications component 330 may include one or more buses, and may further include transmit chain components and receive chain components associated with a transmitter and receiver, respectively, operable for interfacing with external devices. The communications component 330 may be used to receive updated information for the operation or functionality of the computer device 300.

Additionally, the computer device 300 may include a data store 340, which can be any suitable combination of hardware and/or software, which provides for mass storage of information, databases, and programs employed in connection with the operation of the computer device 300 and/or any methods or processes described herein. For example, the data store 340 may be a data repository for operating system 360 (e.g., classical OS, or quantum OS, or both). In one implementation, the data store 340 may include the memory 320. In an implementation, the processor 310 may execute the operating system 360 and/or applications or programs, and the memory 320 or the data store 340 may store them.

The computer device 300 may also include a user interface component 350 configured to receive inputs from a user of the computer device 300 and further configured to generate outputs for presentation to the user or to provide to a different system (directly or indirectly). The user interface component 350 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 350 may include one or more output devices, including but not limited to a display, a speaker, a haptic feedback mechanism, a printer, any other mechanism capable of presenting an output to a user, or any combination thereof. In an implementation, the user interface component 350 may transmit and/or receive messages corresponding to the operation of the operating system 360. When the computer device 300 is implemented as part of a cloud-based infrastructure solution, the user interface component 350 may be used to allow a user of the cloud-based infrastructure solution to remotely interact with the computer device 300.

In connection with the systems described in FIGS. 1-3, in a trapped-ion quantum computer, quantum gates are performed on trapped ion qubits by applying lasers tuned to amplitude, frequency, and phases that are appropriate for each kind of quantum operation. While the programmed frequency and phase can be applied with a constant offset during a quantum operation, the amplitude on the other hand suffers from compression.

Typically, any quantum operation, when programmed in software or firmware, requires the generation of a series of radio frequency (RF) pulses to implement the various parts of the operation, including the quantum gates of the operation. These pulses first propagate through electronic devices, such as RF-mixers, RF-amplifiers, RF-filters, for example, and then get applied to on acousto-optic modulator (AOM) or to an electro-optic modulator (EOM), where the phase, frequency, and amplitude of the RF pulses get imprinted on a laser beam that is used to drive or implement a quantum gate to affect the desired quantum operation. This pathway is referred to as an RF chain, and an example of which is shown in a diagram 400 in FIG. 4.

The diagram 400 shows a computer 410 that provides instructions or control information to an RF synthesizer 420, which in turn produces an RF signal that is sent to RF electronics 430 to control the operation of an AOM or EOM 440. The AOM/EOM 440 controls the phase, frequency, and amplitude (and sometimes polarization) of a laser beam 445 that is applied to a trapped-ion qubit 455 (see e.g., ions 106 in FIG. 1) that are part of a quantum processor 450.

Each component in an RF chain preserves the phase and frequency information of the programmed RF pulse. The amplitude, however, gets compressed such that the response of the laser amplitude as a function of the programmed RF amplitude is non-linear. Furthermore, such a compression can change from time to time due to changes in the laser alignment in the system. Since the laser amplitude determines the strength of driving a quantum gate, such a compression can result in a mismatch between the programmed drive strength and the achieved or applied drive strength of any quantum operation, thereby contributing to loss in fidelity of the operation.

This is a common problem in any laser-based quantum control since the fundamental components of any such RF chain can cause compression. Additionally, the non-linear response can also be dependent on the RF frequency required in various gate pulses. Since various types of quantum operations require RF pulses at different frequencies, the non-linear response of the gate strength to the programmed RF amplitude, can therefore be different in each case. To compensate for this effect, such a non-linear response can be calibrated for each case. Such a calibration can then be used to compensate for this effect in software or firmware to linearize the response.

This disclosure describes a technique to measure the strength of a quantum operation as a function of the programmed amplitude of the RF pulses that drive the quantum gate. It is possible to then extract a polynomial relationship between the two and then apply the inverse of this polynomial function to the programmed RF amplitude, which linearizes the gate strength to the applied RF amplitude. Such calibration can be performed for each type of gate that needs to be implemented on a trapped ion processor (e.g., a quantum processor based on the ions 106 in the chain 110 in FIG. 1) and use them to linearize the gate strength response, for each type of gate, to the programmed amplitude. This procedure makes gate operations more accurate as it corrects for the error or offset between the programmed and applied strength of that quantum operation.

Figure 5A:
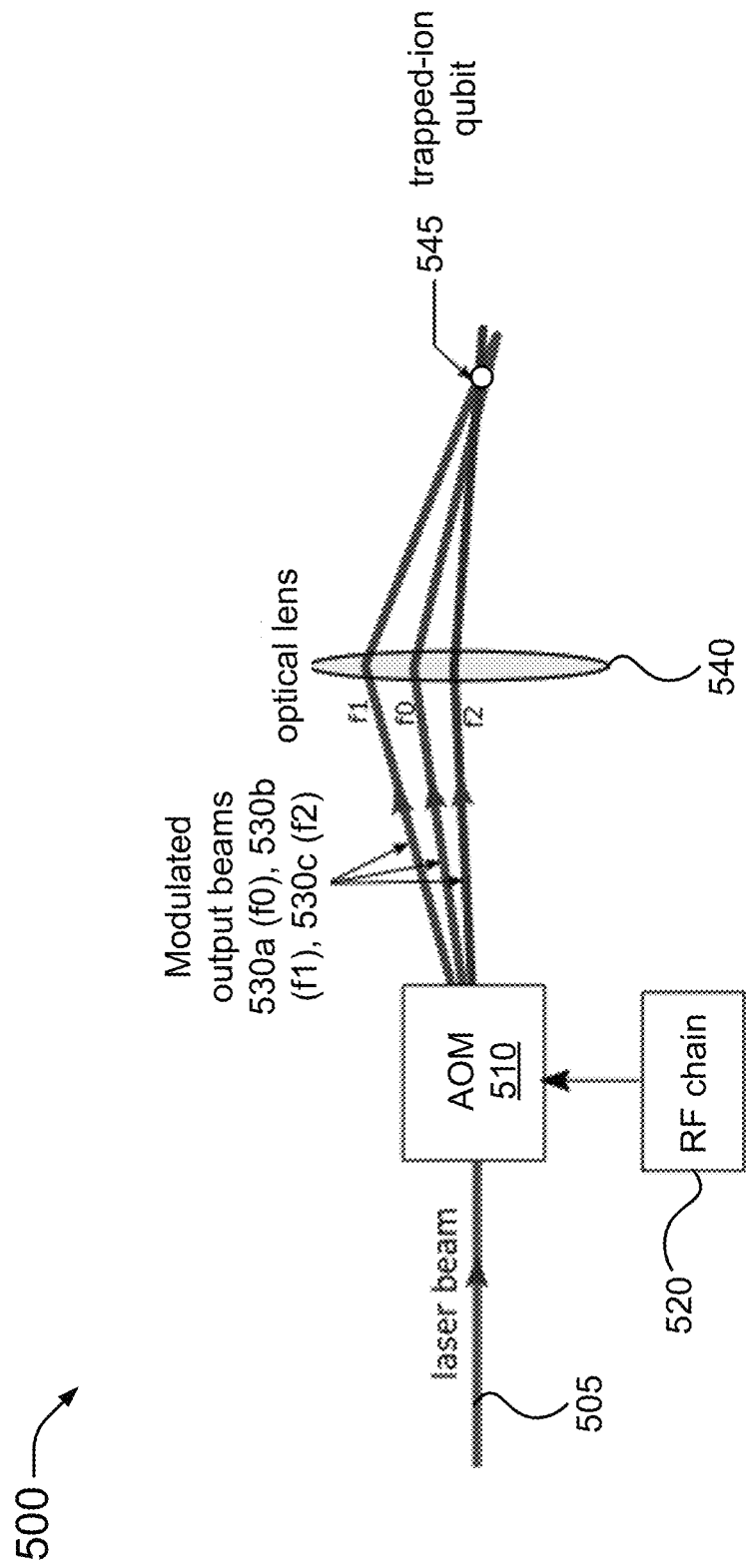
FIGS. 5A and 5B illustrate an example of a mechanism of a translation error due to dissimilar drive RF frequencies in accordance with aspects of this disclosure.
Figure 5B:
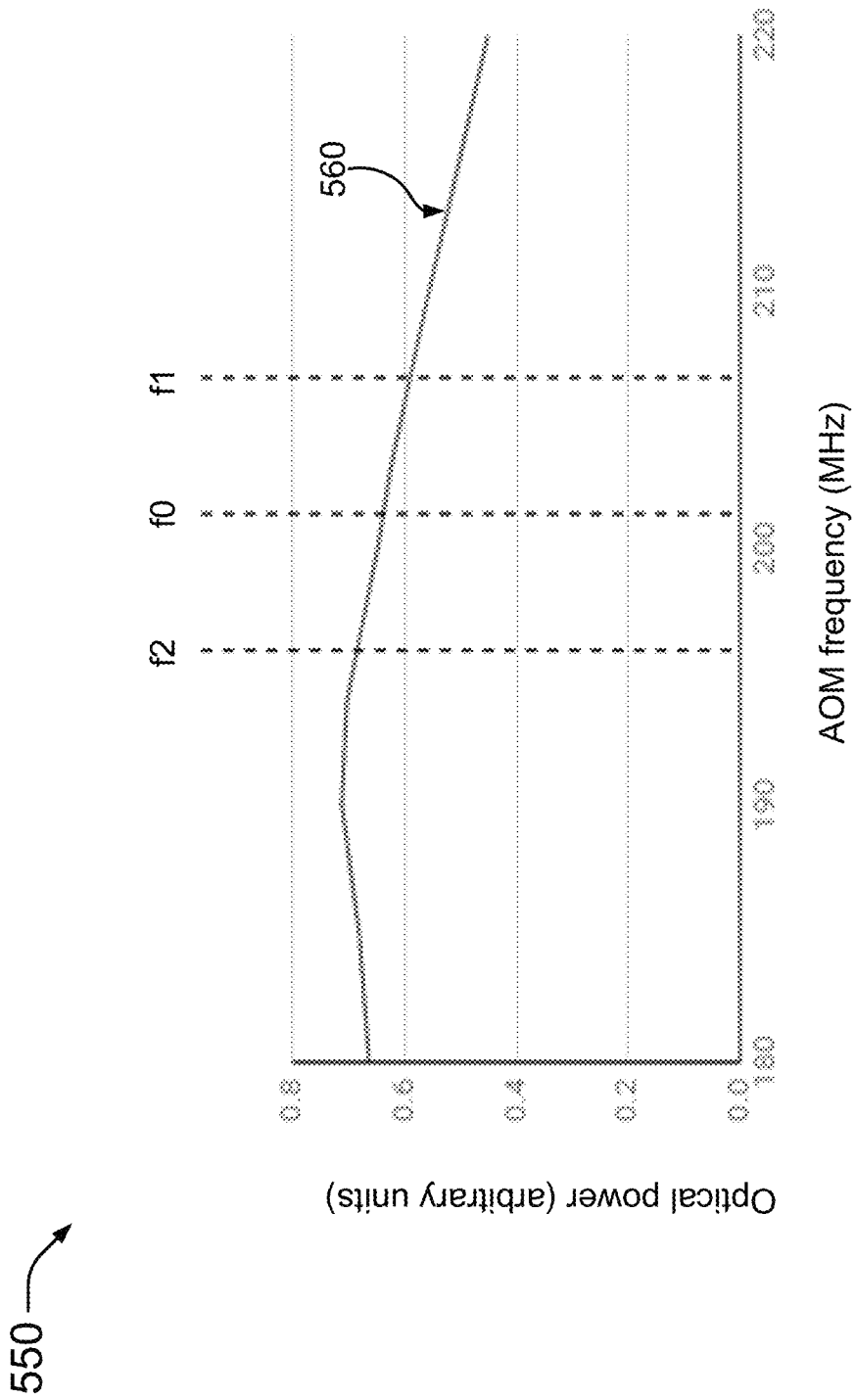

FIGS. 5A and 5B show diagrams 500 and 550, respectively, that illustrate an example of a mechanism of a translation error due to dissimilar drive RF frequencies (e.g., frequencies f0, f1, and f2). In the diagram 500 in FIG. 5A a schematic is shown of how an applied RF pulse from an RF chain 520 enables an AOM (or an EOM) 510 to deflect a laser beam 505 at various angles that are dependent on a programmed frequency, f0, f1, f2, etc. In this example, modulated output beams 530$a$, 530$b$, and 530$c$ are deflected from the AOM 510 for programmed frequencies f0, f1, and f2, respectively. An optical lens 540 helps to focus these beams onto a trapped-ion qubit 545 (see e.g., ions 106 in FIG. 1) to implement and operate quantum gates using the trapped-ion qubit 545. The angle of deflection is dependent on the frequency of the RF pulse and is immune to its phase and amplitude. Due to unequal deflection angle, each drive frequency can cause beams to have a relative misalignment with respect to the qubit, which causes a variation in the strength of driving the corresponding quantum gate. That is, different programmed frequencies or variations from a programmed frequency may result in different strengths of the deflected laser beam when incident on the trapped-ion qubit 545.

The diagram 550 in FIG. 5B shows the dependence of the total deflected laser power on the RF frequencies (f0, f1, f2, etc.), which used to drive the AOM 510 in FIG. 5A, showing a variation that is frequency dependent. As noted above, this effect contributes to error in translating programmed and applied strength of quantum gates as a function of the frequency. In this example, for the same laser beam 505, the deflected optical power is highest on the trapped-ion qubit 545 when f2 is used, lowest when f1 is used, and somewhere in between when f0 is used, where f1>f0>f2.

FIGS. 6A-6E show diagrams 600-680, respectively, that illustrate examples of measurements and corrections of RF amplitude and frequency dependent translation errors of gate strength. In the diagram 600 in FIG. 6A, an energy level diagram is described for a 2-level system representing qubit state-0 and qubit state-1, respectively. The vertical, solid line with arrows 610 represents a driving laser tuned to the frequency difference of the qubit states to drive a quantum operation. The drive frequency w(l, f) is a function of the laser beam frequency/and modulation frequency f of any AOM or EOM. When w=w0, it drives a resonant Rabi flopping transition that flips the qubit state between qubit state-0 and qubit state-1. This can be accomplished by setting the modulation frequency to f0 such that w(l, f0)=w0. The strength of this transition can be measured directly using the ion (i.e., the trapped-ion qubit) and is referred to as the Rabi frequency. When w=wr=w(l, f1), or w=wb=w(l, f2), one can drive a red motional sideband (RSB) or blue motional sideband (BSB) transition, respectively. The RSB and BSB transitions are associated with energy levels above and below the energy level for the qubit state-1. To drive the sideband transitions, the modulation frequency has to be set to f1 and f2, respectively. The drive frequencies f0, f1, and f2 often cause uneven response of the drive strength as illustrated in the diagram 620 in FIG. 6B.

Figure 6A:
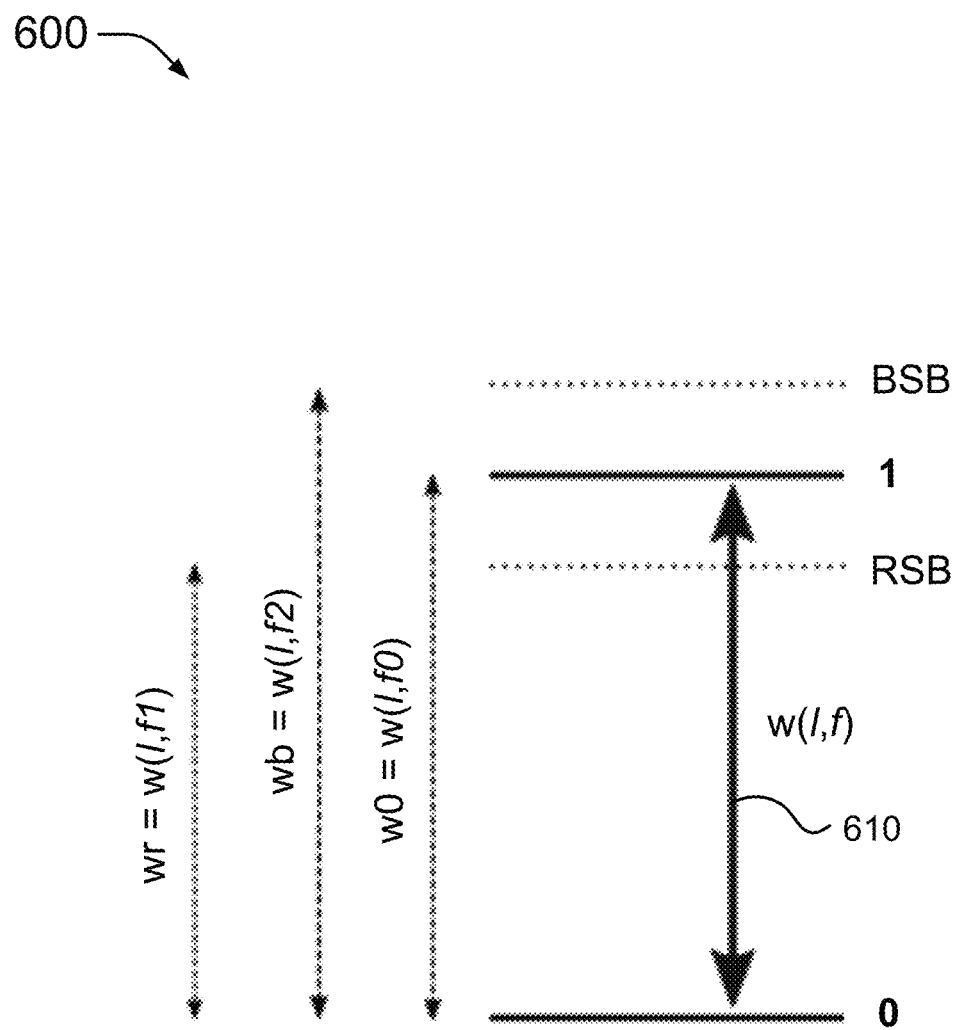
FIGS. 6A-6E illustrate examples of measurements and corrections of RF amplitude and frequency dependent translation errors of gate strength in accordance with aspects of this disclosure.
Figure 6B:
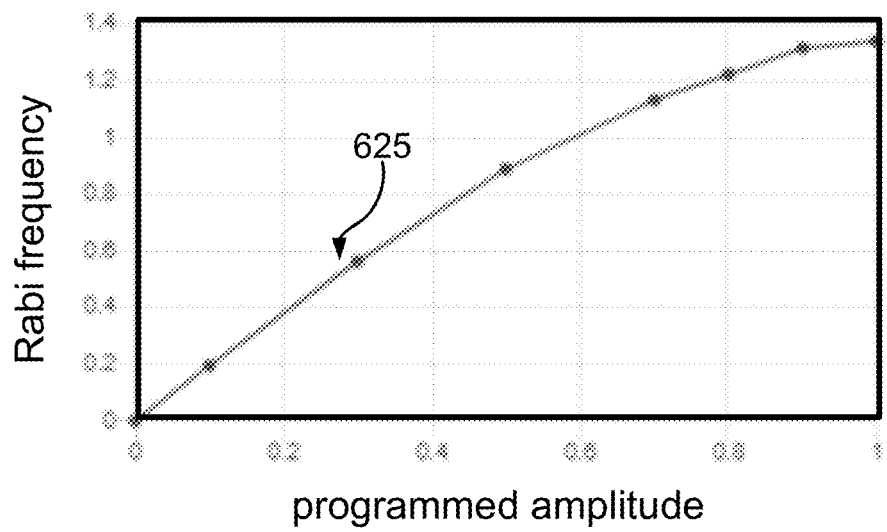

The diagram 620 in FIG. 6B shows the measured Rabi frequency as a function of the programmed RF-amplitude. There is a non-linear response 625 of the gate strength (Rabi-frequency) to that of the programmed RF-amplitude (programmed strength). This characterization is performed by keeping the laser beam and modulation frequencies to l and f0, respectively.

Figure 6C:
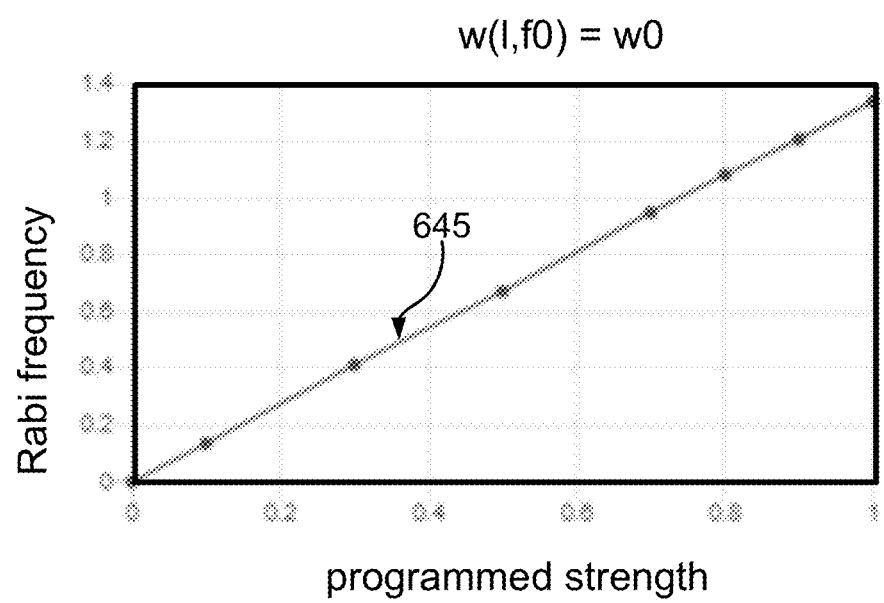

In the diagram 640 in FIG. 6C the Rabi frequency response 645 after a correction is made based on a look up table (LUT) generated from the results in FIG. 6B. The response is a desired linear response but can in general be programmed to whatever is required in practice based on the LUT. The LUT may be implemented in a part of the quantum computer or QIP system that is configured to correct for translation errors.

Figure 6D:
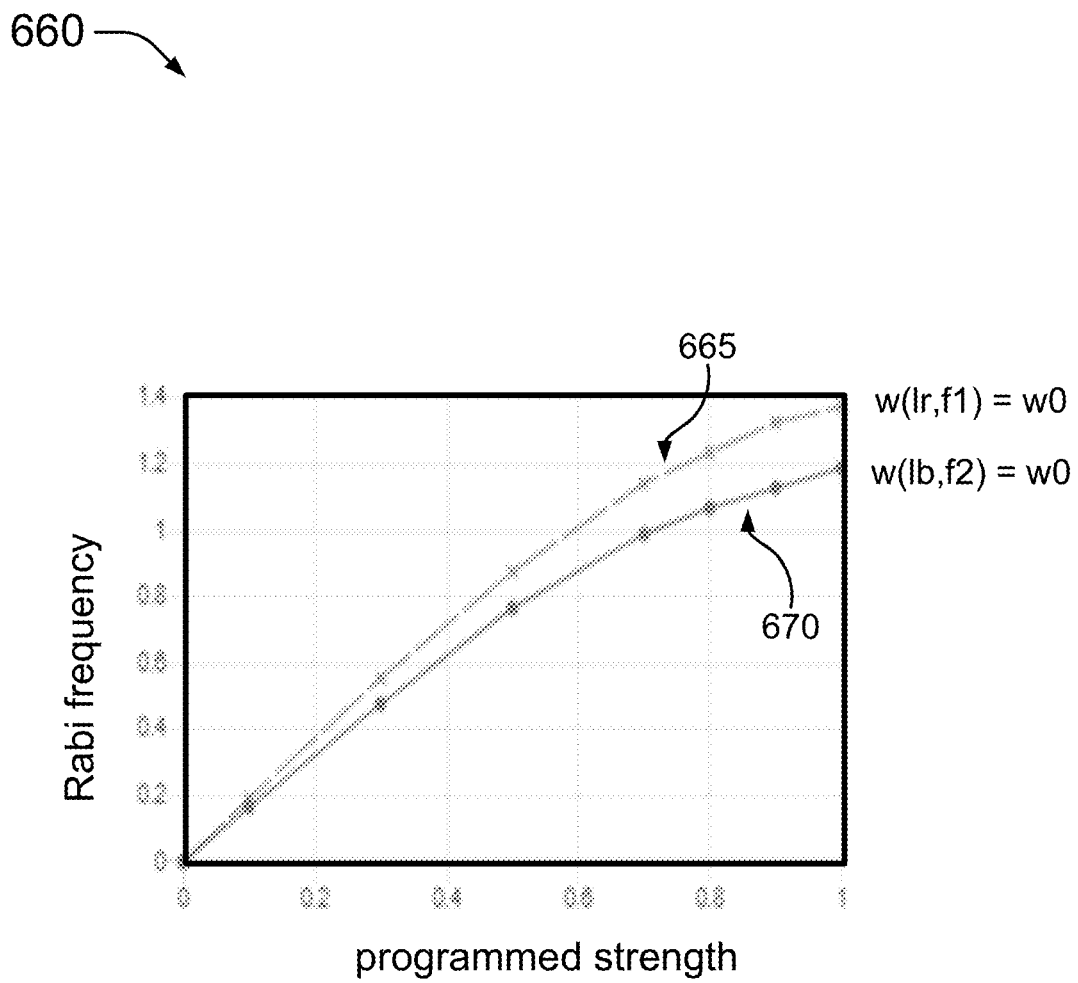

In the diagram 660 in FIG. 6D a technique is described for measuring blue and red sideband Rabi frequencies using the resonant qubit flip transition by setting w=w0. To make sure that one captures the compressions at f1, and f2, which are the modulation drive frequencies of the RSB and BSB, respectively, the laser frequency is changed (which, in this case, does not contribute to any compression). This can be expressed as w(lr,f1)=w(lb,f2)=w0, where lr and lb are the frequencies to which the laser is tuned such that one can drive a qubit-flip transition instead of the red and blue sideband transitions, respectively. This allows for direct measurement of the red (non-linear response 665) and blue (non-linear response 670) sideband gate strength as a function of programmed RF-amplitude. Due to unequal optical power that may arise at modulation drive frequencies f1 and f2 (see e.g., FIG. 5B), the Rabi frequencies are also uneven throughout the amplitude range of the RF.

Figure 6E:
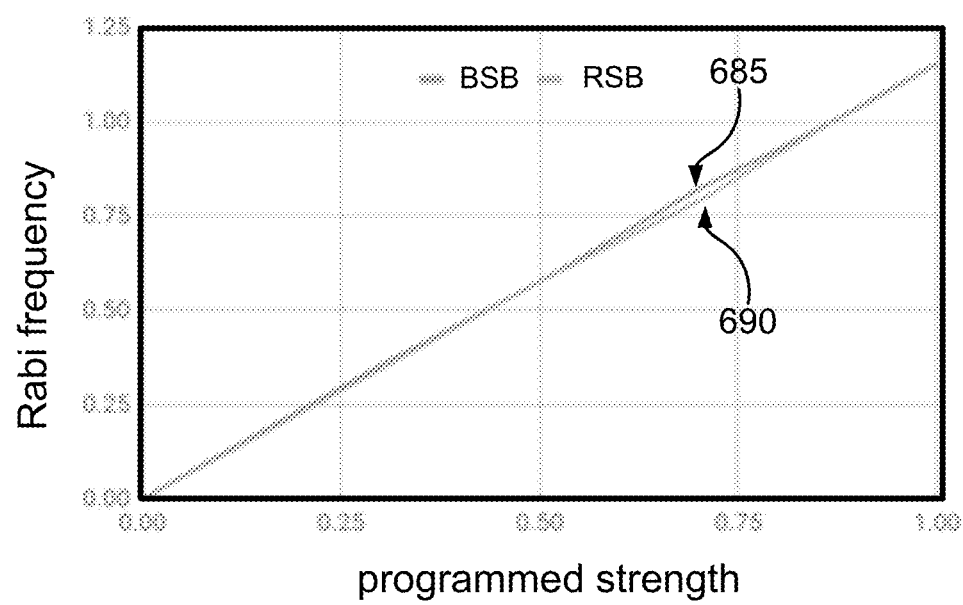

In the diagram 680 in FIG. 6E, based on the results in FIG. 6D, an LUT for the RSB and BSB can be generated and the LUT can be used to correct for the amplitude and frequency translation errors to make the RSB and BSB strength linearly dependent on the programmed RF-amplitude and also make them equal. Both these corrections are necessary, for example, while driving entangling gate operations in trapped ion chains. In this example, the linearized response 685 is for the BSB and the linearized response 690 is for the RSB. As noted above, these linearized responses are made to be almost equal to each other.

Figure 7:
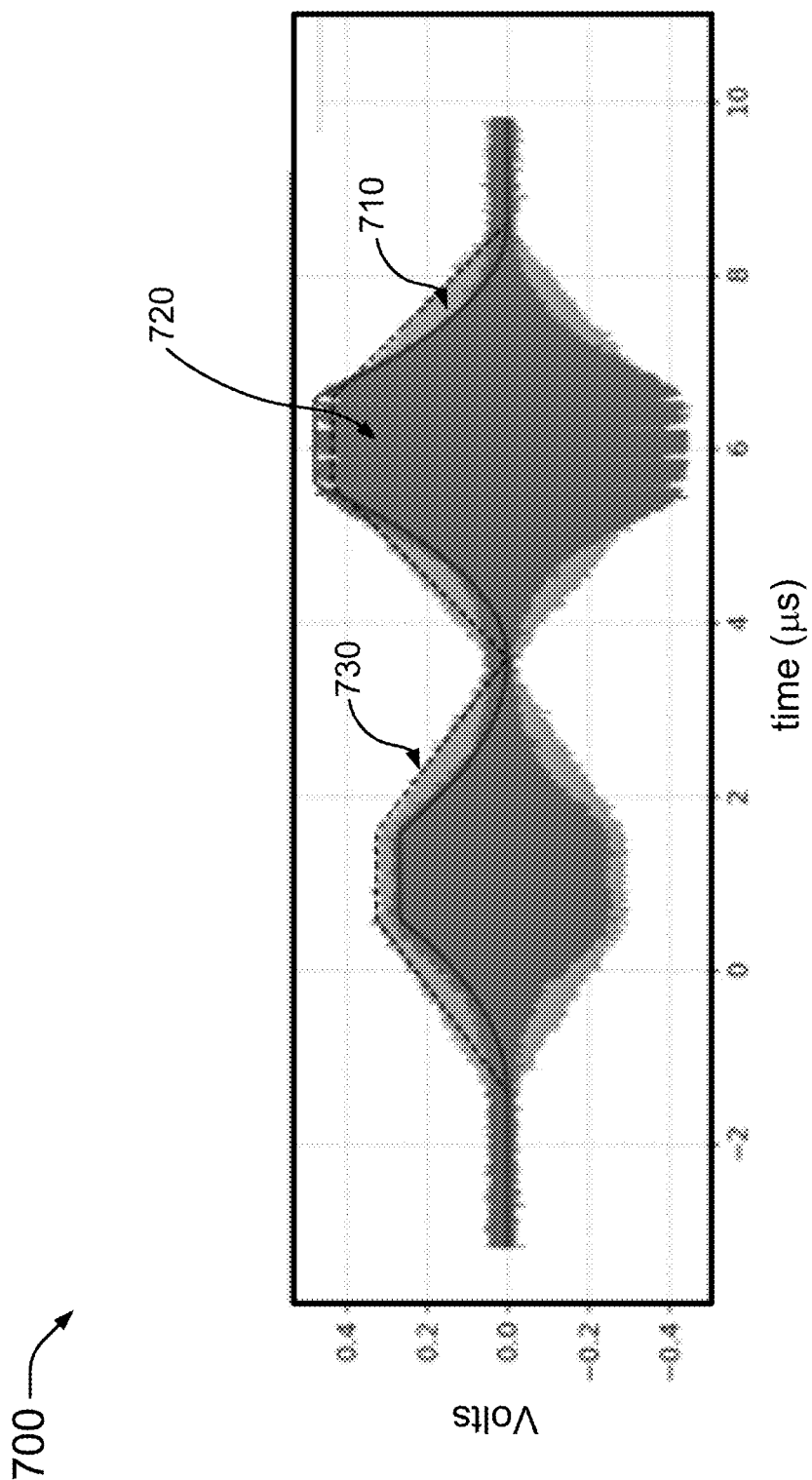
FIG. 7 illustrates an example of the application of correction of RF amplitude based on programmed amplitude and frequency of the RF drive in accordance with aspects of this disclosure.

FIG. 7 shows a diagram 700 that illustrates an example of the application of correction of RF amplitude based on programmed amplitude and frequency of the RF drive, for example, a direct digital synthesizer or DDS. The region 710 is the real time voltage output from the RF source without the amplitude correction (regular DDS output), whereas the region 720 is after the correction is applied (adjusted output). A dashed line 730 is a spline representation of an envelope of the region 710. It is illustrated that one can simply compute the translation error and program the compensated amplitude profile, based on a LUT (as described above) for any arbitrary shape of the amplitude modulation.

Figure 8:
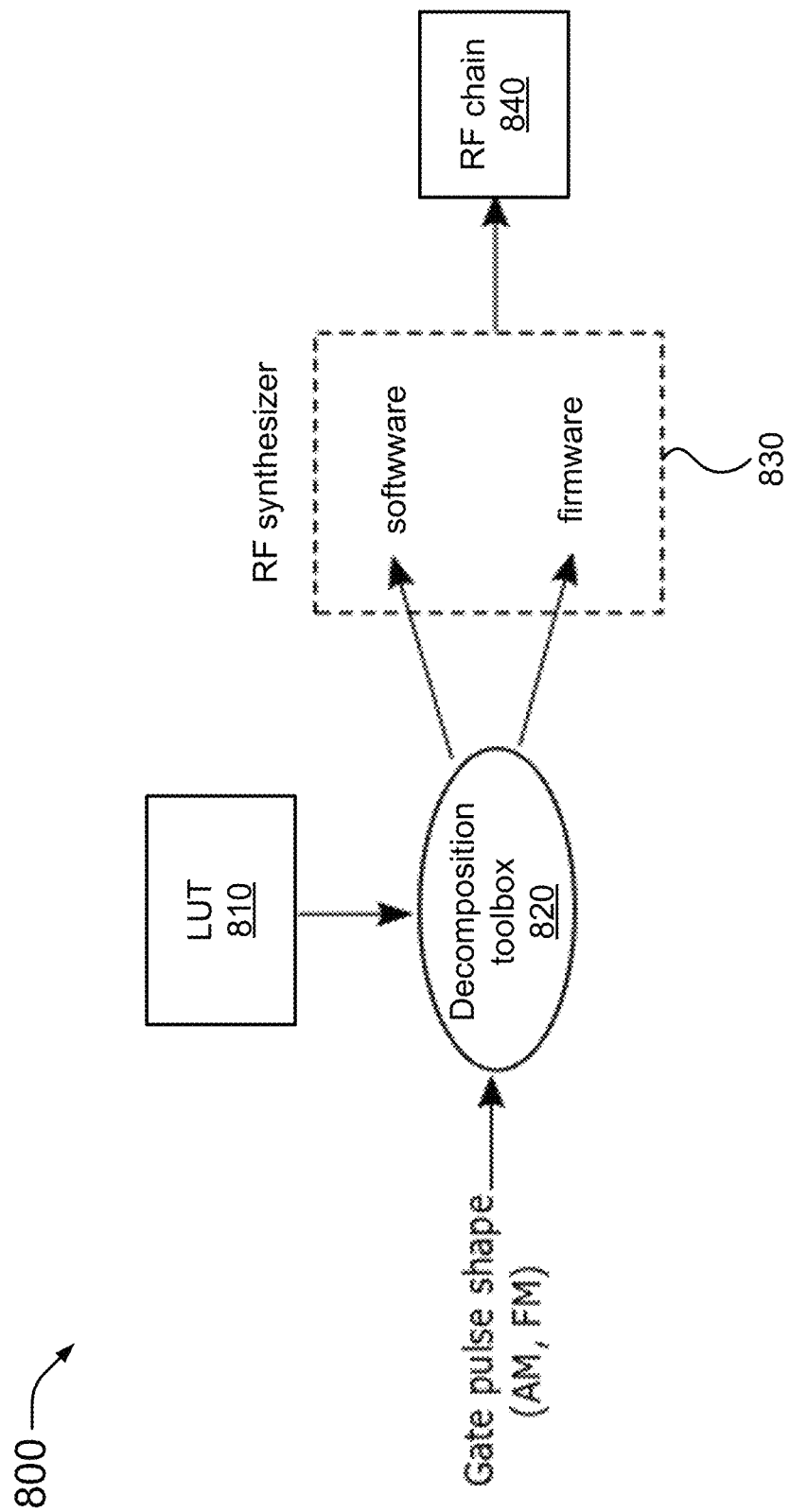
FIG. 8 illustrates an example of an implementation of frequency and amplitude dependent corrections of gate strength in accordance with aspects of this disclosure.

FIG. 8 shows a diagram 800 that illustrates an example of an implementation of frequency and amplitude dependent corrections of gate strength. In this example, a decomposition toolbox 820 is used to decide how to convert the amplitude modulation (AM) and Frequency Modulation (FM) based correction into subcomponents that are to be implemented through programming of the software and the firmware of the RF-synthesizer 830 (e.g., a DDS), respectively. An output of the RF synthesizer 830 is then applied to an RF chain 840. The corrections are based on pre-calibrated look up tables 810 (LUTs) for each kind of the gate (as described above in connection with FIGS. 6A-6E). The decomposition toolbox is further configured to perform a mathematical transformation to express the gate modulation into polynomial expressions that can be optimally implemented in software and firmware. This optimization is performed to improve speed of gate implementation and minimize required memory to store waveforms, which express each type of gate.

It is to be understood that one or more components shown in the diagram 800 may be implemented as part of the RF chain described above in connection with the diagram 400 in FIG. 4. Moreover, one or more components shown in the diagram 800 may be implemented as part of the optical and trap controller 220.

Figure 9:
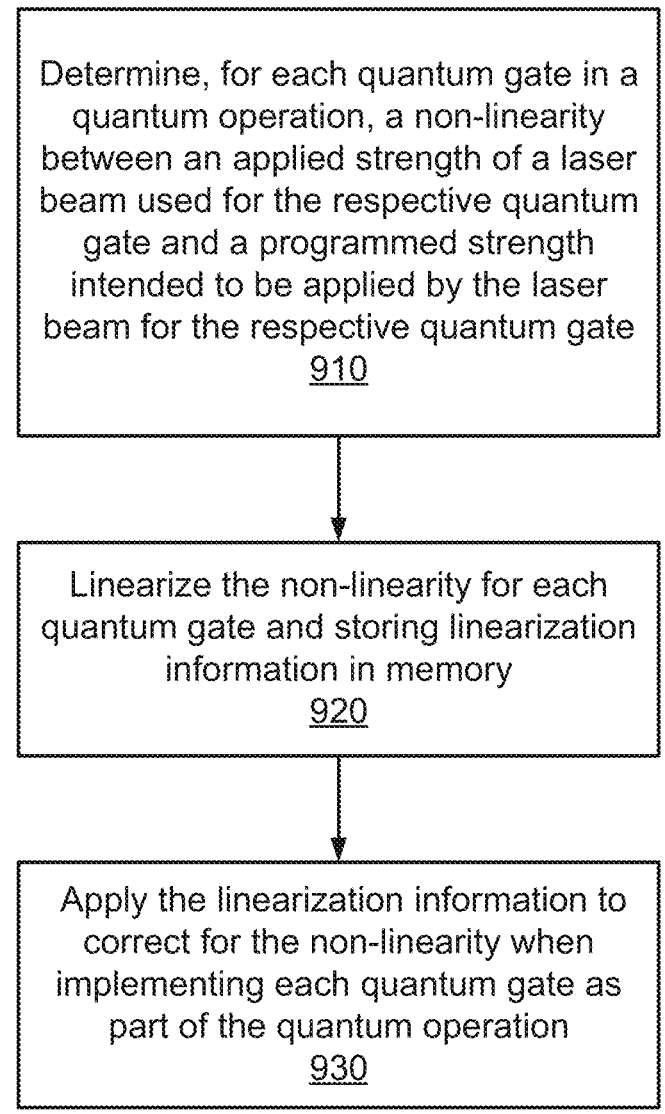
FIG. 9 illustrates a method for correcting translation errors that occur between a programmed strength and an applied strength of quantum gates in accordance with aspects of this disclosure.

FIG. 9 illustrates a method 900 for correcting translation errors that occur between a programmed strength and an applied strength of quantum gates in accordance with aspects of this disclosure. At 910, the method 900 includes determining, for each quantum gate in a quantum operation, a non-linearity (e.g., compression) between an applied strength of a laser beam used for the respective quantum gate and a programmed strength intended to be applied by the laser beam for the respective quantum gate. At 920, the method 900 includes linearizing the non-linearity for each quantum gate and storing linearization information in memory. At 930, the method 900 includes applying the linearization information to correct for the non-linearity when implementing each quantum gate as part of the quantum operation.

In another aspect of the method 900, the programmed strength is RF amplitude that is programmed in an RF chain.

In another aspect of the method 900, the method 900 further includes measuring the applied strength of a respective quantum gate by measuring a Rabi-frequency of the respective quantum gate.

In another aspect of the method 900, the applied strength of the laser beam is based on a laser beam frequency and a programmed modulation frequency of a device that modulates the laser beam. The device may be an AOM or an EOM (e.g., AOM/EOM 440). Moreover, the programmed modulation frequency may correspond to a qubit state transition Rabi frequency (see e.g., FIG. 6A). Similarly, the programmed modulation frequency may correspond to an RSB Rabi frequency or a BSB Rabi frequency (see e.g., FIG. 6A).

In another aspect of the method 900, storing the linearization information in memory includes storing the linearization information in one or more LUTs (e.g., LUT 810) and applying the linearization information to correct for the non-linearity includes retrieving at least some of the linearization information from the one or more LUTs.

In another aspect of the method 900, applying the linearization information to correct for the non-linearity includes employing a decomposition toolbox (e.g., decomposition toolbox 820) to decide how to convert the linearization information into subcomponents that are to be implemented through programming of software, firmware, or both, of an RF synthesizer (e.g., RF synthesizer 830). The RF synthesizer generates a series of pulses based on the converted linearization information that are applied to an RF chain such that the applied strength of the laser beam used for the respective quantum gate and the programmed strength intended to be applied by the laser beam for the respective quantum gate are linear.

In connection with the method 900, a quantum computer is described that includes a trap (e.g., trap 270) configured to hold multiple ions (e.g., ions 106) for implementing quantum gates. The quantum computer also includes a controller (e.g., optical and trap controller 220). The controller is configured to determine, for each quantum gate in a quantum operation, a non-linearity between an applied strength of a laser beam used for the respective quantum gate and a programmed strength intended to be applied by the laser beam for the respective quantum gate. The controller is further configured to linearize the non-linear relationship for each quantum gate and storing linearization information in memory. The controller is further configured to apply the linearization information to correct for the non-linearity when implementing each quantum gate as part of the quantum operation.

In another aspect of the quantum computer, the programmed strength is RF amplitude that is programmed in an RF chain. The RF chain (e.g., RF chain in the diagram 400, RF chain 840) may be part of the controller.

In another aspect of the quantum computer, the controller is further configured to measure the applied strength of a respective quantum gate by measuring a Rabi-frequency of the respective quantum gate.

In another aspect of the quantum computer, the applied strength of the laser beam is based on a laser beam frequency and a programmed modulation frequency of a device that modulates the laser beam. The device may be an AOM or an EOM (e.g., AOM/EOM 440) and may be part of or included in the controller. The programmed modulation frequency may correspond to a qubit state transition Rabi frequency. Moreover, the programmed modulation frequency may correspond to an RSB Rabi frequency or a BSB Rabi frequency.

In another aspect of the quantum computer, the controller includes the memory and the memory includes one or more LUTs (e.g., LUT 810). Moreover, the controller may be configured to store the linearization information in the one or more LUTs and to apply the linearization information to correct for the non-linearity by retrieving at least some of the linearization information from the one or more LUTs.

In another aspect of the quantum computer, the controller may include a decomposition toolbox (e.g., decomposition toolbox 820) and an RF synthesizer (e.g., RF synthesizer 820), and the controller is further configured to apply the linearization information to correct for the non-linearity by employing the decomposition toolbox to decide how to convert the linearization information into subcomponents that are to be implemented through programming of software, firmware, or both, of the RF synthesizer. The controller may include at least a portion of an RF chain (e.g., RF chain in the diagram 400, RF chain 840) and the RF synthesizer is configured to generate a series of pulses based on the converted linearization information that are applied to an RF chain such that the applied strength of the laser beam used for the respective quantum gate and the programmed strength intended to be applied by the laser beam for the respective quantum gate are linear.

Some or all of the components or features of the controller may be implemented in, for example, the optical and trap controller 220. Alternatively, some of the features of the controller may be implemented by the optical and trap controller 220 in combination with the general controller 205. The components or features of the controller may be implemented in, for example, the processor 310 or the QPU 310c when considering the architecture of a quantum computer described in FIG. 3.

The previous description of the disclosure is provided to enable a person skilled in the art to make or use the disclosure. Various modifications to the disclosure will be readily apparent to those skilled in the art, and the common principles defined herein may be applied to other variations without departing from the scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method, comprising:
    determining, for each quantum gate in a quantum operation, a non-linearity between an applied strength of a laser beam used for the respective quantum gate and a programmed strength intended to be applied by the laser beam for the respective quantum gate;
    linearizing the non-linearity for each quantum gate and storing linearization information in memory; and
    applying the linearization information to correct for the non-linearity when implementing each quantum gate as part of the quantum operation.

2. The method of claim 1, wherein the programmed strength is a radio frequency (RF) amplitude that is programmed in an RF chain.

3. The method of claim 1, further comprising measuring the applied strength of a respective quantum gate by measuring a Rabi-frequency of the respective quantum gate.

4. The method of claim 1, wherein the applied strength of the laser beam is based on a laser beam frequency and a programmed modulation frequency of a device that modulates the laser beam.

5. The method of claim 4, wherein the device is an acousto-optic modulator or an electro-optic modulator.

6. The method of claim 4, wherein the programmed modulation frequency corresponds to a qubit state transition Rabi frequency.

7. The method of claim 4, wherein the programmed modulation frequency corresponds to a red sideband (RSB) Rabi frequency or a blue sideband (BSB) Rabi frequency.

8. The method of claim 1, wherein:
    storing the linearization information in memory includes storing the linearization information in one or more look up tables (LUTs), and
    applying the linearization information to correct for the non-linearity includes retrieving at least some of the linearization information from the one or more LUTs.

9. The method of claim 1, wherein applying the linearization information to correct for the non-linearity includes employing a decomposition toolbox to decide how to convert the linearization information into subcomponents that are to be implemented through programming of software, firmware, or both, of an RF synthesizer.

10. The method of claim 9, wherein the RF synthesizer generates a series of pulses based on the converted linearization information that are applied to an RF chain such that the applied strength of the laser beam used for the respective quantum gate and the programmed strength intended to be applied by the laser beam for the respective quantum gate are linear.

11. A quantum computer, comprising:
a trap configured to hold multiple ions for implementing quantum gates; and
a controller configured to:
determine, for each quantum gate in a quantum operation, a non-linearity between an applied strength of a laser beam used for the respective quantum gate and a programmed strength intended to be applied by the laser beam for the respective quantum gate,
linearize the non-linearity for each quantum gate and to store linearization information in memory, and
apply the linearization information to correct for the non-linearity when implementing each quantum gate as part of the quantum operation.

12. The quantum computer of claim 11, wherein the programmed strength is a radio frequency (RF) amplitude that is programmed in an RF chain.

13. The quantum computer of claim 11, wherein the controller is further configured to measure the applied strength of a respective quantum gate by measuring a Rabi-frequency of the respective quantum gate.

14. The quantum computer of claim 11, wherein the applied strength of the laser beam is based on a laser beam frequency and a programmed modulation frequency of a device that modulates the laser beam.

15. The quantum computer of claim 14, wherein the controller includes the device and the device is an acousto-optic modulator or an electro-optic modulator.

16. The quantum computer of claim 14, wherein the programmed modulation frequency corresponds to a qubit state transition Rabi frequency.

17. The quantum computer of claim 14, wherein the programmed modulation frequency corresponds to a red sideband (RSB) Rabi frequency or a blue sideband (BSB) Rabi frequency.

18. The quantum computer of claim 11, wherein:
the controller includes the memory and the memory includes one or more look up tables (LUTs),
the controller is configured to store the linearization information in the one or more look up tables (LUTs), and
the controller is configured to apply the linearization information to correct for the non-linearity by retrieving at least some of the linearization information from the one or more LUTs.

19. The quantum computer of claim 11, wherein:
the controller includes a decomposition toolbox and an RF synthesizer, and
the controller is configured to apply the linearization information to correct for the non-linearity by employing the decomposition toolbox to decide how to convert the linearization information into subcomponents that are to be implemented through programming of software, firmware, or both, of the RF synthesizer.

20. The quantum computer of claim 19, wherein the controller includes at least a portion of an RF chain and the RF synthesizer is configured to generate a series of pulses based on the converted linearization information that are applied to an RF chain such that the applied strength of the laser beam used for the respective quantum gate and the programmed strength intended to be applied by the laser beam for the respective quantum gate are linear.

\* \* \* \* \*